US012757356B2

(12) United States Patent
Burant

(10) Patent No.: US 12,757,356 B2
(45) Date of Patent: Oct. 6, 2026

(54) SYSTEM AND METHOD FOR A SMART POWER MODULE

(71) Applicant: Richard J. Burant, Hartland, WI (US)

(72) Inventor: Richard J. Burant, Hartland, WI (US)

( * ) Notice: Subject to any disclaimer, the term of this patent is extended or adjusted under 35 U.S.C. 154(b) by 379 days.

(21) Appl. No.: 18/353,153

(22) Filed: Jul. 17, 2023

(65) Prior Publication Data

US 2025/0031348 A1 Jan. 23, 2025

(51) Int. Cl.
*H05K 7/20* (2006.01)
*G01R 22/06* (2006.01)
*H05K 5/02* (2006.01)

(52) U.S. Cl.
CPC ......... *H05K 7/2039* (2013.01); *G01R 22/063* (2013.01); *H05K 5/0217* (2013.01)

(58) Field of Classification Search
CPC .. H05K 7/2039; H05K 5/0217; G01R 22/063; H04Q 9/00; H04Q 2209/00; H04Q 2209/10; H04Q 2209/30; H04Q 2209/40; H04Q 2209/60; H04Q 2209/70; H04Q 2209/80; H04Q 2209/84; H04Q 2209/88
See application file for complete search history.

(56) References Cited

U.S. PATENT DOCUMENTS

| | | | | |
|---|---|---|---|---|
| 9,397,553 B2 * | 7/2016 | Jung | ................. | H02M 3/33507 |
| 9,523,491 B2 * | 12/2016 | Bailey | ........................ | F21V 5/04 |
| 11,116,062 B1 * | 9/2021 | Leizerovich | .............. | G06F 1/28 |
| 12,330,698 B2 * | 6/2025 | Swar | ........................ | H01Q 9/18 |
| 2018/0212369 A1 * | 7/2018 | Bulmer | .................. | H01R 24/20 |

* cited by examiner

*Primary Examiner* — Franklin D Balseca

(57) ABSTRACT

Embodiments for a smart power apparatus for connecting to a street pole are described. The apparatus includes a casing with a top plate, a bottom plate, and a wall to connect the top plate and the bottom plate with cooling fins. A communication module communicates with a control module and an input electrical connector receives an input alternating current (AC) having a weatherproof connection. A conversion module receives the input AC from the input electrical connector and produces an output direct current (DC). Further, a metering module connects to circuits of the output DC and uses a sensor to measure the output DC. An output DC connector provides the output DC that is regulated by the control module using the communication module.

17 Claims, 7 Drawing Sheets

SYSTEM AND METHOD FOR A SMART POWER MODULE

FIELD OF THE INVENTION

The present disclosure relates to a smart power module such as a lamppost-based power interface used on a street pole. More particularly, but not exclusively, the present disclosure relates to a connector device that provides a power interface to multiple customers for street communication equipment.

BACKGROUND OF THE INVENTION

Evolving societies constantly face the problem of aging infrastructure. With the advent of new technologies, it is cumbersome and costly for managers and investors to keep investing in modernization, new technology requirements and societal expectations.

Street infrastructure such as streetlights/light poles/telephone poles, billboards, and information kiosks are all available for their primary purpose of lighting streets etc. but are also envisioned to meet other needs with new technological changes. One application is to ensure adequate lighting for the safety of pedestrians, cyclists, vehicles, and passengers on public transport. Another application is to provide accessibility at low cost.

Smart streetlights refer to network-connected streetlights, where each of the streetlight is equipped with an outdoor light controller and/or sensor. Smart streetlights automatically adjust light intensity based on sunset/sunrise times, daily schedules, presence of people, traffic conditions, and/or weather conditions. This saves considerable energy and reduces maintenance costs.

Generally, streetlights are mounted alongside of a road, parking lot, or the like on a streetlight/street pole, a lamppost, or some other elevated structure. Nowadays, light emitting diode (LED) based luminaires are installed to provide bright, controllable lighting with lower power consumption. While providing safety and cost-effective solutions, local administrators, governments, and private entities designs most streetlight systems in conformance to one or more standards as set by a standards body.

Smart streetlights are often equipped with one or more sensors such as, photocell/ambient light sensor, motion sensor, acoustic sensor, accelerometer, seismic sensor, parking sensor, cameras, audio devices, temperature sensors, pollution measurement sensors, GPS devices, wireless chargers, E-chargers, traffic management devices, and alike.

In general, it is not sufficient to just improve a single component of street light infrastructure, but it is desirable to integrate various and disparate infrastructures to create a synergistic result that can be derived from using their various functions in combination with one another. Surveillance cameras and relays for wireless communication networks are now mounted on street poles in populated areas and similar municipal and public facilities using a variety of housings and connectors.

However, due to the critical location of these devices, developing/installing an entire city-scale infrastructure is difficult, time-consuming, and expensive. Also, the lack of standard protocols makes the installation ineffective & costly. Therefore, there is a need to improve street lighting infrastructure and include social services that involve improving street lighting architecture.

SUMMARY OF THE INVENTION

This summary is provided to introduce concepts related to systems and methods for a smart power module and the concepts are further described below in the detailed description.

Various systems are used for taking an AC power input from a light pole luminaire (such as via NEMA connection point) and provide a metering for a line and load. The present arts are vague and undecisive to determine if the AC power input is from the luminaire or bypassed to obtain from a main power line. The smart power module, in accordance with the embodiments of this disclosure, will be able to take the AC input power from the luminaire and provide Alternating Current (AC) outputs as well as Direct Current (DC) outputs allowing for a greater range of end users/products to pull power from the luminaire. In accordance with another embodiment of this disclosure, a separate utility grade metering for all outputs allows multiple end users to take either AC or DC power and have utility grade metering so each end user could monitor their own energy usage on respective equipment/product/end use device.

In accordance with an embodiment of this disclosure, a smart power apparatus for connecting to a street pole is disclosed. The smart power apparatus comprises a casing having a top plate, a bottom plate, and at least one wall to connect the top plate and the bottom plate with cooling fins. The casing comprises a communication module to communicate with a control module, an input electrical connector integrated with the casing to receive an input alternating current (AC) from a street pole connector using a weatherproof connection, a conversion module operable to receive the input AC from the input electrical connector and produce an output direct current (DC), the output DC is produced using a switch mode power supply (SMPS) transformer. A metering module that connects to circuits of the output DC with at least one sensor to measure the output DC, the metering module communicates with the control module using the communication module and an output DC connector integrated with the casing to provide the output DC using a weatherproof connection, the output DC is regulated by the control module using the communication module.

In yet another embodiment, the smart power apparatus comprises, the conversion module operable to receive the input AC from the input electrical connector and produce an output AC and the metering module connected to circuits of the output AC with at least one sensor to measure the output AC; the metering module communicates with the control module using the communication module. Also, an output AC connector integrated with the casing to provide the output AC using a weatherproof connection, the output AC is regulated by the control module using the communication module.

In accordance with an embodiment of this disclosure, a smart power apparatus for connecting to a street pole is disclosed. The smart power apparatus comprises a casing having a top plate, a bottom plate, and at least one wall to connect the top plate and the bottom plate with cooling fins. The casing comprises a communication module to communicate with a control module, an input electrical connector integrated with the casing to receive an input alternating current (AC) from a street pole connector using a weatherproof connection and a conversion module operable to receive the input AC from the input electrical connector and produce an output AC. A metering module connected to circuits of the output AC with at least one sensor to measure the output AC; the metering module communicates with the control module using the communication module, an output AC connector integrated with the casing to provide the output AC using a weatherproof connection, the output AC is regulated by the control module using the communication module.

In yet another embodiment, the smart power apparatus comprises, the conversion module operable to receive the input AC from the input electrical connector and produce an output direct current (DC), the metering module connected to circuits of the output DC with at least one sensor to measure the output DC; the metering module communicates with the control module using the communication module. An output DC connector integrated with the casing to provide the output DC using a weatherproof connection, the output DC is regulated by the control module using the communication module.

In accordance with the embodiments of this disclosure, a method for monitoring and controlling a smart power apparatus for connecting to a street pole is disclosed. The method comprising receiving an input current using an input electrical connector from a street pole connector having a weatherproof connection and converting the received input current from the input electrical connector to at least one output current. Further, measuring the at least one output current with at least one sensor of a metering module, the metering module communicates with a control module using a communication module; and providing the at least one output current using an output current connector having a weatherproof connection, the at least one output current is regulated by the control module using the communication module.

In yet another embodiment of this disclosure, a method for monitoring and controlling a smart power apparatus is disclosed that receives at least one customer profile parameter for the output current using the communication module from the control module and the output current is regulated by the control module using the communication module in accordance with the at least one customer profile parameter.

In accordance with the embodiments of this disclosure, the method generates a corresponding utility grade metering for the output current and assisting a user to monitor energy usage.

In accordance with the embodiments of this disclosure, the method has the control module that communicates with a plurality of the smart power apparatus each having a corresponding communication module, each of the output current connector of the plurality of the smart power apparatus has a unique identity and the control module regulates each of the output current of each of the output current connector.

In accordance with the embodiments of this disclosure, the method has the control module that has access to a plurality of customer profiles, the control module regulates each of the output current of a plurality of the smart power apparatus in accordance with at least one customer profile of the plurality of customer profiles.

In accordance with the embodiments of this disclosure, the method has the control module that regulates each of the output current of a plurality of the smart power apparatus in accordance with one customer profile parameter of the plurality of customer profiles, the one customer profile parameter of the plurality of customer profiles is augmented by monitoring each of the output current of the plurality of the smart power apparatus.

It is an object of the subject matter to provide a number of advantages depending on the particular aspect, embodiment, implementation, and/or configuration.

It is another object of the subject matter to provide a platform that can provide reliable execution, scalability, and value-added services while controlling operational effort and costs.

It is another object of the subject matter to efficiently manage numerous instances simultaneously, work in different regulatory requirements, enable resources to collaborate and work together efficiently, and effectively with user friendly interfaces.

These and other implementations, embodiments, processes, and features of the subject matter will become fully apparent when the following detailed description is read with the accompanying experimental details. However, both the foregoing summary of the subject matter and the following detailed description of it represent one potential implementation or embodiment and are not restrictive of the present disclosure or other alternate implementations or embodiments of the subject matter.

BRIEF DESCRIPTION OF THE DRAWINGS

Further advantages of the disclosure will become apparent by reference to the detailed description of preferred embodiments when considered in conjunction with the following drawings.

DETAILED DESCRIPTION OF INVENTION

Figure 1:
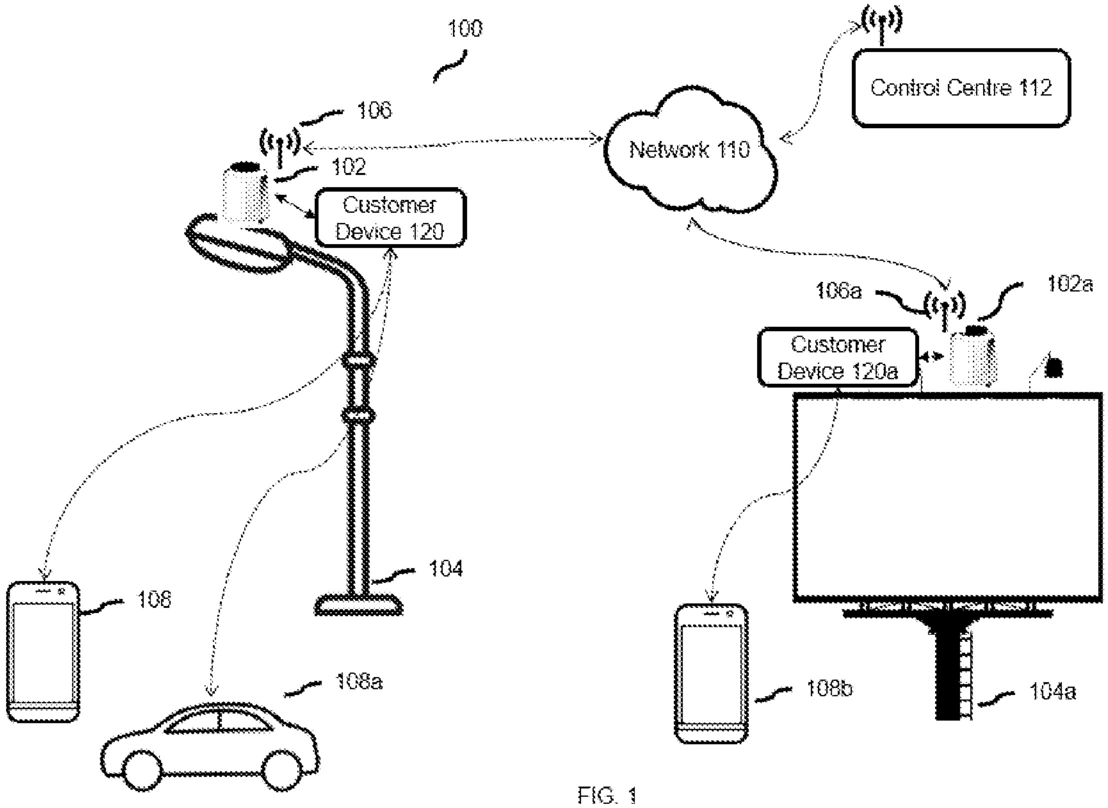
FIG. 1 illustrates a multifunctional smart power apparatus in accordance with the embodiments of this disclosure.

The following detailed description is presented to enable any person skilled in the art to make and use the subject matter. For purposes of explanation, specific details are set forth to provide a thorough understanding of the present subject matter. However, it will be apparent to one skilled in the art that these specific details are not required to practice the subject matter. Descriptions of specific applications are provided only as representative examples. Various modifications to the preferred embodiments will be readily apparent to one skilled in the art, and the general principles defined herein may be applied to other embodiments and applications without departing from the scope of the subject matter. The present subject matter is not intended to be limited to the embodiments shown but is to be accorded the widest possible scope consistent with the principles and features disclosed herein.

The present disclosure discloses a method for monitoring and controlling a smart power apparatus for connecting to a street pole. The method comprises receiving an input current using an input electrical connector from a street pole connector having a weatherproof connection and converting the received input current from the input electrical connector to at least one output current. The disclosure further comprises measuring the at least one output current with at least one sensor of a metering module, the metering module communicates with a control module using a communication module and providing the at least one output current using an output current connector having a weatherproof connection, the at least one output current is regulated by the control module using the communication module. The disclosure further comprises receiving at least one customer profile parameter for the output current using the communication module from the control module, the output current is regulated by the control module using the communication module in accordance with the at least one customer profile parameter.

The present disclosure also aims to provide a method to generate a corresponding utility grade metering for the output current and assisting a user to monitor energy usage. Further, the control module communicates with a plurality of the smart power apparatus each having a corresponding communication module, and each of the output current connector of the plurality of the smart power apparatus has a unique identity and the control module regulates each of the output current of each of the output current connector.

The present disclosure also aims to provide a method to access a plurality of customer profiles by the control module that regulates each of the output current of a plurality of the smart power apparatus in accordance with at least one customer profile of the plurality of customer profiles. Further, the control module regulates each of the output current of a plurality of the smart power apparatus in accordance with one customer profile parameter of the plurality of customer profiles, and the one customer profile parameter of the plurality of customer profiles is augmented by monitoring each of the output current of the plurality of the smart power apparatus.

The present disclosure provides a smart power apparatus system for connecting to a street pole. The smart power apparatus system comprises a casing having a top plate, a bottom plate, and at least one wall to connect the top plate and the bottom plate with cooling fins. The casing further comprises a communication module to communicate with a control module, an input electrical connector integrated with the casing to receive an input alternating current (AC) from a street pole connector using a weatherproof connection and a conversion module operable to receive the input AC from the input electrical connector and produce an output direct current (DC), and the output DC is produced using a switch mode power supply (SMPS) transformer. Further, a metering module connected to circuits of the output DC with at least one sensor to measure the output DC, the metering module communicates with the control module using the communication module and an output DC connector integrated with the casing to provide the output DC using a weatherproof connection, the output DC is regulated by the control module using the communication module.

The present disclosure also aims to provide a system where the casing further comprises, the conversion module operable to receive the input AC from the input electrical connector and produce an output AC and the metering module connected to circuits of the output AC with at least one sensor to measure the output AC, the metering module communicates with the control module using the communication module and an output AC connector integrated with the casing to provide the output AC using a weatherproof connection, the output AC is regulated by the control module using the communication module.

FIG. 1 illustrates a multifunctional smart power apparatus 100 in accordance with the embodiments of this disclosure.

The illustration shows a high-level view of a multi-point smart power module system connected to a network 110. In one example, a public environment is shown with multiple street infrastructure elements such as streetlights, light poles, telephone poles, billboards, and information kiosks are installed. A streetlight 104, an advertisement billboard 104*a* is shown in the public environment, any number of such equipment can be interchangeably used as a streetlight.

Each of a smart power module apparatus 102, 102*a* is connected to the streetlight 104 and the advertisement billboard 104*a* respectively. Each of the streetlight 104, 104*a* is equipped with an outdoor lighting controller, and/or sensors. Each of the streetlight 104, 104*a* is a smart streetlight that automatically adjust light intensity based on sunset/sunrise times, daily schedules, presence of people, traffic conditions, and/or weather conditions. This saves considerable energy and reduces maintenance costs. Smart street lighting collects and transmits data in near real time to a central management system. Smart streetlights are often equipped with one or more sensors. Such sensors are connected to the streetlight 104, 104*a*, and alike using the smart power module apparatus 102, 102*a*, and alike. The sensors are specifically designed for customers and for delivering a target function and depicted as a customer device 120 and a customer device 120*a*, connected to the smart power module apparatus 102, 102*a*, respectively.

Each of the smart power module apparatus 102, 102*a* has a communication module that controls the streetlight 104, 104*a*, and associated customer devices 120, 120*a* using instruction/commands from a control centre 112 via the network 110. The respective communication modules of the smart power module apparatus 102, 102*a* communicates with the network 110 via a connector 106, 106*a* respectively. In one embodiment, the connector 106, 106*a* is one of an ethernet connector, an IoT connector, an embedded Cellular Antenna or any available network connector device.

The customer devices 120, 120*a* are sensors including but not limited to photocell/ambient light sensor, motion sensor, acoustic sensor, accelerometer, seismic sensor, parking sensor, cameras, audio devices, temperature sensors, pollution measurement sensors, GPS devices, wireless chargers, E-chargers, traffic management devices, wi-fi connectors, and alike. Some of the customer devices 120, 120*a* may be equipped to communicate with external devices such as, a mobile phone, a handheld device, a laptop, a vehicle, such as a car a truck or alike. The external devices are shows as 108, 108*a*, 108*b* that may communicate and get instructions or share data packets with the customer devices 120, 120*a*.

Figure 2:
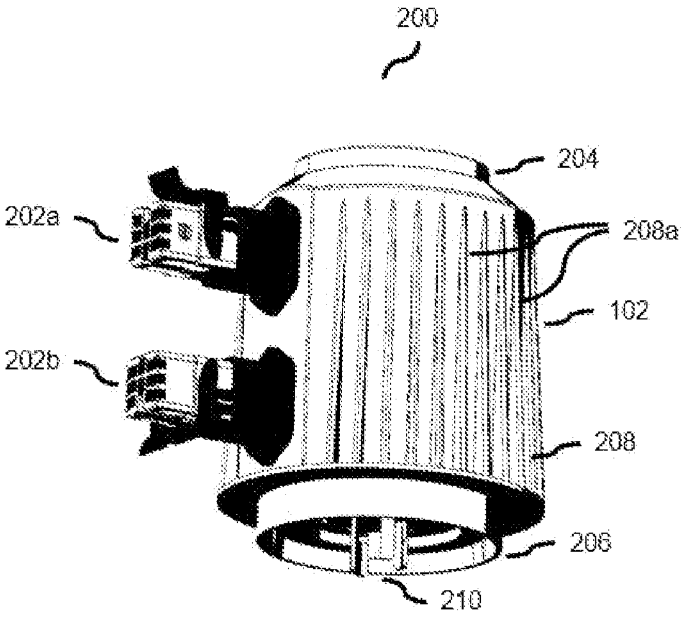
FIG. 2 is a schematic diagram showing a partial structure of a smart power apparatus according to an embodiment of the present disclosure.

FIG. 2 is a schematic diagram 200 showing a partial structure of a smart power apparatus according to an embodiment of the present disclosure.

In one embodiment, the smart power module apparatus 102 is shown with additional details. The smart power module apparatus 102 has a top plate 204, a base plate 206, a wall 208 to connect the top plate 204 with the base plate 206 as a cover. The wall 208 is designed with cooling fins 208*a* as depicted.

The top plate 204 is a top cover assembly of the smart power module apparatus 102 having a NEMA connector connected to its top. While shipping, the top plate 204 is sealed with top bypass/shorting power plate cover.

The base plate 206 is a notched baseplate with ultrasonic welding to fix into the streetlight 104, 104*a* top. A bottom of the base plate 206 supports the standard, modular waterproof NEMA connector as an input electrical connector 210. After component assembly the base plate 206 attaches to the top of the streetlight 104, 104*a*. The entire assembly is potted.

The wall 208 is like a cover/housing made with semi-transparent dark polycarbonate having the metallic Aluminium cooling fins 208*a*. It also has an embedded Cellular Antenna supporting CAT M1. A Radio frequency (RF) signal and a sensor circuitry is also present inside the housing. A printed circuit board (PCB) is housed that is designed keeping in mind the type of communication and Sensors needed on this system. The input AC to output AC/DC converter SMPS transformer, current sensing transformer and the outbound connector hard wired to customer defined waterproof terminals inside the housing 208.

The housing 208 further has an output DC connector 202*a*, an output AC connector 202*b*. The output current connectors are interchangeably shown in the diagram. Any number of output DC and output AC connectors can be used in the housing 208.

In one embodiment, a housing 208 of a smart power module apparatus 102 has an output DC connector 202*a*. The smart power module apparatus 102 does not support Ethernet connection and works with an IoT Modem/Module for connectivity. The module 102 provides alarm/status & metering information via IoT to a control centre 112 using a secure portal and API.

In one embodiment, a housing 208 of a smart power module apparatus 102 has an output AC connector 202*b*. The smart power module apparatus 102 does not support Ethernet connection and works with an IoT Modem/Module for connectivity. The module 102 provides alarm/status & metering information via IoT to a control centre 112 using a secure portal and API.

In one embodiment, a smart power module apparatus 102 provides a dual 48 VDC cable power output and two dry contact alarms through the lower power port terminal. In one example, the smart power module apparatus 102 is operable over an Input AC Voltage Range of 85-305 V with an Input Voltage Frequency of 47-63 Hz and DC Output of −48 VDC. A housing 208 for the module 102 is to be of max width ~4.25" and max height of ~3.85". It supports alarms/status & metering via IoT and 2 dry contacts from the lower connector. The smart power module apparatus 102 is designed as "plug and play" for easy installation/maintenance.

In one embodiment, a streetlight 104, 104*a* has a NEMA or Zhaga base connector options for near plug-and-play installation. The NEMA receptacle (ANSI C136.41) is a streetlight connector derived from the world-famous American outlet standard. Zhaga is a new, more compact connector for street use, designed specifically for today's slimline LED lights. In one example, an embedded controller i.e., a compact controller that is attached to the lamp is used. In another example, a pole mounted controller which is a flexible option for smart street lighting projects is used. The connectors are used to retrofit existing street lighting installations with minimal visual impact and little civil engineering work reducing the cost and turnaround time.

In one example, the input electrical connector 210 is connected to the streetlight 104, 104*a* connector (NEMA or otherwise) with a waterproof connection. The housing 208 of the module 102 is designed to meet a minimum IP rating of IP66, Impact protection of IK07. The module 102 is designed to operate in a GR-3108 Class 4 environment, with temperatures ranging between −40° C. (−40° F.) and +70° C. (+158° F.).

Figure 3:
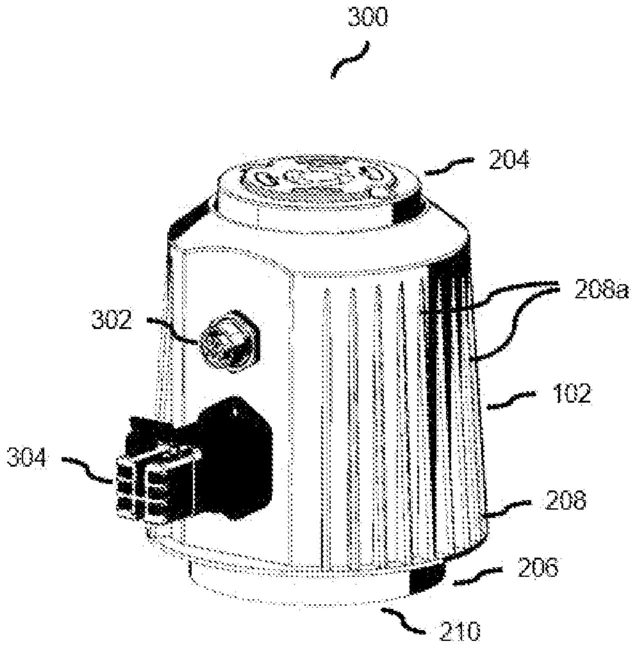
FIG. 3 is a schematic diagram showing a partial structure of a smart power apparatus according to another embodiment of the present disclosure.

FIG. 3 is a schematic diagram 300 showing a partial structure of a smart power apparatus according to another embodiment of the present disclosure.

In one embodiment, a housing 208 of a smart power module apparatus 102 has an output DC connector 304. The smart power module apparatus 102 does not work with an IoT Modem/Module for connectivity but supports Ethernet connection using an ethernet connector 302. The module 102 provides alarm/status & metering information via the ethernet connector 302 to a control centre 112 using a secure portal and API.

In one embodiment, a housing 208 of a smart power module apparatus 102 has an output AC connector (like 304, not shown separately). The smart power module apparatus 102 does not work with an IoT Modem/Module for connectivity but supports Ethernet connection using an ethernet connector 302. The module 102 provides alarm/status & metering information via the ethernet connector 302 to a control centre 112 using a secure portal and API.

In one example, the smart power apparatus module 102 is designed to withstand temperatures between-40° C. (−40° F.) and +85° C. (+185° F.) during storage, ambient humidity levels in the range of 5% to 100% relative humidity, exposure to salt fog for 30 days per GR-3108 corrosion resistance standards.

In one embodiment, a smart power module 102 has device input & output specifications with input voltage range of 85V-305V (AC), input voltage frequency of 47-63 Hz (to be in line with input voltage range), input current of 1.2 A (to be in line with input voltage range), inrush current of 15 A (to be in line with input voltage range), last gasp power (super capacitor) of 1 minute runtime (post power outage), leakage current of <0.8 A (to be in line with input voltage range), output voltage of 48V (DC), rated output current of 3 A, output voltage accuracy of +/−1%, line regulation (30 W-200 W) of +/−0.5%, load regulation of +/−0.5%, ripple (20 MHz p2p) of 240 MV, temperature coefficient of +/−0.03%/C, minimum load of 0% and stand-by power consumption of 0.1 W.

In one embodiment, a smart power module 102 has metering-single channel parameter specifications as voltage inputs of 85V-305V line to neutral, current measurement of solid core CT, measurement type of true rms up to 9th harmonic, line frequency of 50/60 Hz, waveform sampling of 1.2 kS/s, integration period of 1 s, measurements-voltage (V), current (A), active power (kW), apparent power, power factor, peak demand, THD, frequency, and accuracy of 0.2% ANSI C 12.20-2015 CLASS 0.5, IEC 62052, IEC 62053, IEC 62056, real time clock backup of 15 Years-Updated to Super Capacitor Design, last gasp power (super capacitor) of 1 Minute Runtime (Post power outage-Comms), super capacitor size of 10 F to 30 F, display of 4 LEDs to indicate various conditions. LED Lighting may not be visible to user if thermal cooling requirements require the Top Cover to be made from cast aluminium and/or Potted.

In one embodiment, a smart power module 102 has a housing 208 and is made of Polycarbonate or Aluminium and/or potting. All finishes are clear anodized, or paint/powder coated (outdoor rated UV protection). All hardware has a coating for maximum protection against corrosion and salt fog. All screws, bolts, and washers are stainless steel grade A2 (type 316). The casing material shall conform to minimum bend radius and bend relief requirements. All sharp edges be broken, and all burrs removed from all assembly parts. All gasket material shall be EPDM rubber, F-05031 (Black) with adhesive backing (TDS-CC93), or equivalent. The smart power module 102 shall have a 120/240 VAC Input power connection interface (IP66) to the control board via a connection to the all-weather power connector. All internal power wiring shall be 16 AWG or as defined by the connector wire harness, to the all-weather connector(s).

In one embodiment, a smart power module 102 has circuitry, firmware architecture has provision of enabling of IT, by installing a SIM Card, for the said deployments. The module will operate with 3A of potential load. The smart power module 102 provides a DC Output Voltage. (Nominally, −48V DC).

In one embodiment, a smart power module 102 has egress Ports that are used for facilitating a pass-through tunnel that may allow meter data, alarm data, etc. to be communicated out of the smart power module 102 via the all-weather ethernet port.

Figure 4:
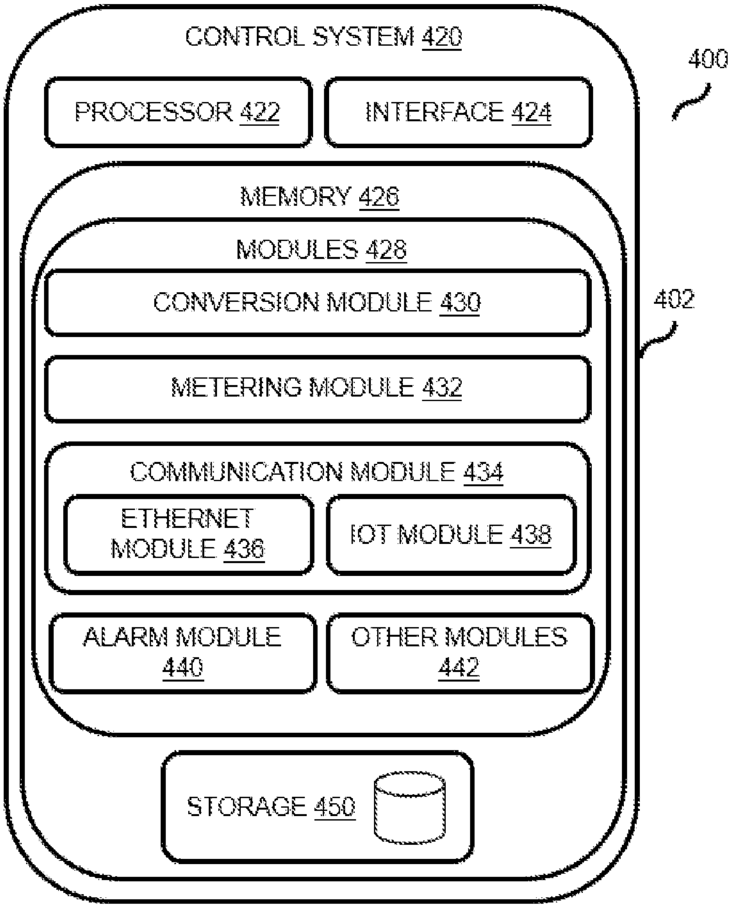
FIG. 4 is a schematic diagram of functional modules for implementing a method for monitoring and controlling a smart power apparatus according to an embodiment of the present disclosure.

FIG. 4 is a schematic diagram 400 of functional modules for implementing a method for monitoring and controlling a smart power apparatus according to an embodiment of the present disclosure.

In one implementation, a control system 420 implements a method for monitoring and controlling a smart power apparatus for connecting to a street pole 104 on a smart power apparatus module 102 connected to a control centre 112 and operated by a user. The control system 420 includes a processor(s) 422, interface(s) 424, and a memory 426 coupled or in communication to the processor(s) 422. The processor(s) 422 may be implemented as one or more microprocessors, microcomputers, microcontrollers, digital signal processors, central processing units, state machines, logic circuitries, and/or any devices that manipulate signals based on automated grading application instructions. Among other capabilities, the processor(s) 422 is configured to fetch and execute computer-readable instructions stored in the memory 426.

Although the present disclosure is explained by considering a scenario in which the system is implemented as an application on a computer system, the systems and methods can be implemented in a variety of computing systems. The computing systems that can implement the described method(s) include, but are not limited to, mainframe computers, client-server architecture, workstations, personal computers, desktop computers, minicomputers, servers, multiprocessor systems, laptops, tablets, SCADA systems, smartphones, mobile computing devices, cloud network, web services, web solutions, and the like.

The interface(s) 424 may include a variety of software and hardware interfaces, for example, a web interface, a graphical user interface, etc., allowing the control system 420 to interact with the user. Further, the interface(s) 424 may enable the control system 420 to communicate with other computing devices, such as web servers and external data servers as the need may be.

A network 110 used for communicating between all elements may be a wireless network, a wired network, or a combination thereof. The network can be implemented as one of the different types of networks, such as an intranet, local area network LAN, wide area network WAN, the internet, and the like. The network may either be a dedicated network or a shared network. The network further has access to storage devices residing at a client site computer, a host site server or computer, over the cloud, or a combination thereof and the like. The storage has one or many local and remote computer storage media, including one or many memory storage devices, databases, and the like.

The memory 426 can include any computer-readable medium known in the art including, for example, volatile memory (e.g., RAM), and/or non-volatile memory (e.g., EPROM, flash memory, etc.), over the cloud distributed storage, and the like. In one embodiment, the memory 426 includes module(s) 428 and a storage 450.

The modules 428 further includes a conversion module 430, a metering module 432, a communication module 434, an alarm module 440, and other modules 442. It will be appreciated that any of such modules may be represented as a single module or a combination of different modules. Furthermore, the memory 426 further includes the storage 450 that serves, amongst other things, as a repository for storing data fetched, processed, received, and generated by one or more of the modules 428. The storage 450 includes, for example, operational data, workflow data, and other data. The storage 450 includes multiple databases including but not limited to a measurement data, a control data, a calibration data, a test data, a profile data, and other modules data. The working of the control system 420 and related method and associated modules, sub-modules, methods may be explained in parts also using other figures as explained above or below.

In one embodiment, the control system 420 receives user instruction data through the interface 424 from the control centre 112. The modules 428 of the control system 420 process the instructions from the control centre 112 using the processor 422 while using the system data storage 450, the other modules 442, and supporting components.

The conversion module 430 of the control system 420 operable to receive the input AC from the input electrical connector and produce an output direct current (DC), the output DC is produced using a switch mode power supply (SMPS) transformer. The conversion module 430 of the control system 420 operable to receive the input AC from the input electrical connector and produce an output alternating current (AC).

The metering module 432 of the control system 420 connected to circuits of the output DC with at least one sensor to measure the output DC. The metering module 432 of the control system 420 connected to circuits of the output AC with at least one sensor to measure the output AC. The metering module 432 communicates with a control module of the control centre 112 using the communication module 434. The metering module 432 provides a corresponding utility grade metering for the output DC to the control module using the communication module 434 and assists a user to monitor energy usage. The metering module 432 provides a corresponding utility grade metering for the output AC to the control module using the communication module 434 and assists a user to monitor energy usage.

The communication module 434 of the control system 420 communicates with the control module of the control centre 112. The control module of the control centre 112 regulates the output DC using the communication module 434. The output DC is provided using a weatherproof connection with an output DC connector integrated with the casing. The control module of the control centre 112 regulates the output AC using the communication module 434. The output AC is provided using a weatherproof connection with an output AC connector integrated with the casing.

The control module communicates with a plurality of the smart power apparatus 102, 102*a* each having a corresponding communication module 434, each of the output AC connector of the plurality of the smart power apparatus 102, 102*a* has a unique identity and the control module regulates each of the output AC of each of the output AC connector. The control module has access to a plurality of customer profiles, the control module regulates each of the output AC of a plurality of the smart power apparatus 102, 102*a* in accordance with at least one customer profile of the plurality of customer profiles.

The communication module 434 of the control system 420 has an ethernet communication module 436 and communicates with the control module using an ethernet connector. The communication module 434 of the control system 420 has an Internet of Things (IoT) enabled communications module 438 and communicates with the control module using an IoT connector to provide a high-bandwidth communication medium interface.

The control module communicates with a plurality of the smart power apparatus 102, 102*a* each having a corresponding communication module, each of the output DC connector of the plurality of the smart power apparatus 102 has a unique identity and the control module regulates each of the output DC of each of the output DC connector. The control module has access to a plurality of customer profiles, the control module regulates each of the output DC of a plurality of the smart power apparatus 102 in accordance with at least one customer profile of the plurality of customer profiles. The control module regulates each of the output DC of a plurality of the smart power apparatus 102 in accordance with one customer profile parameter of the plurality of customer profiles, the one customer profile parameter of the plurality of customer profiles is augmented by monitoring each of the output DC of the plurality of the smart power apparatus 102, 102*a*.

The alarm module 440 of the control system 420 indicates a status about the smart power apparatus 102.

The other modules 442 of the control system 420 performs multiple tasks, such as an analytics module would generate analytics based on the collected data, a report module would generate data for a dashboard or reports for a specific usage by users, management, assessors, or reviewers.

Figure 5:
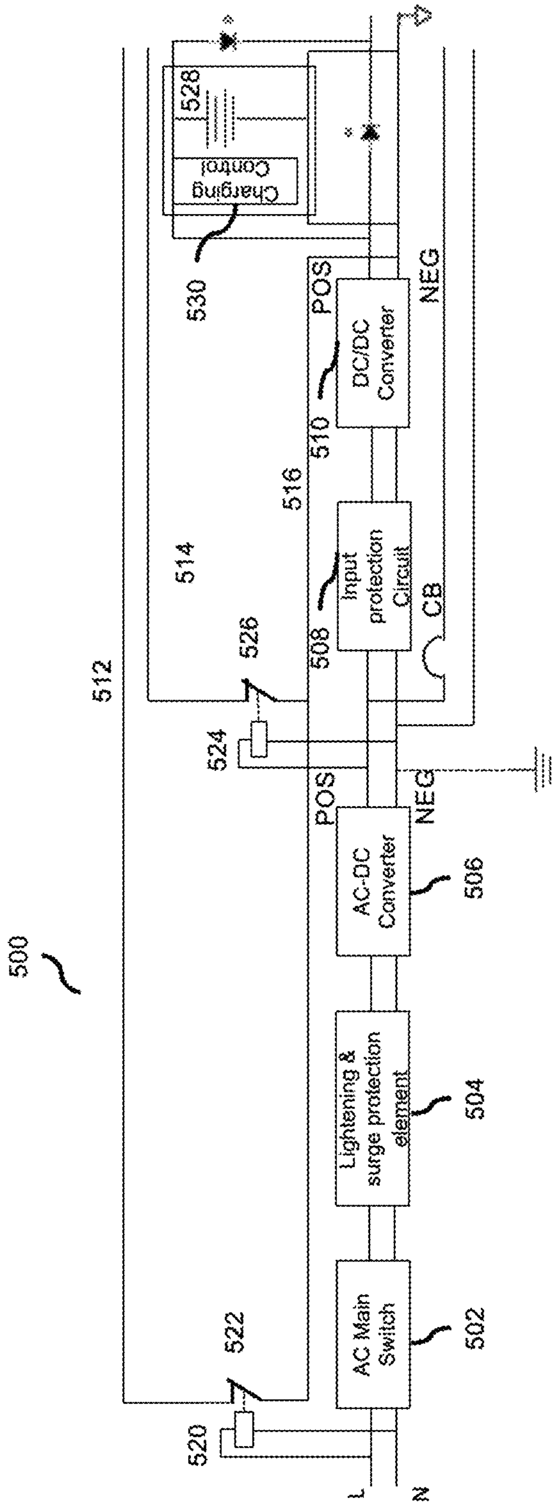
FIG. 5 is a circuit diagram of a method for monitoring and controlling a smart power apparatus according to an embodiment of the present disclosure.

FIG. 5 is a circuit diagram 500 of a method for monitoring and controlling a smart power apparatus according to an embodiment of the present disclosure.

In one embodiment, a control system 420 has an alarm module 440. The alarm module 440 has alarm requirements that include real-time event driven notifications OTA. In one example, the alarm sent OTA on the following conditions, first gasp-message sent when power is first applied to the module or after restoration of a utility outage. Last gasp-Utility Power outage notification, Meter power quality alarms, AC power over voltage, AC power under voltage, AC Change in phase, AC Power supply failure, DC output power failure. The communication failure greater than 3 tries to connect to the server-Server and device driven, RSSI-outside normal operational parameters and GPS coordinates & RSSI will be sent daily to Fusion Software Platform. Further, Dry Contact alarms on AC failure alarm (Normally Closed), DC failure alarm (Normally Closed), etc.

A detailed view of an alarm module 440 is shown along with other elements of the smart power module apparatus 102 in 500. An AC main switch 502 provides an output to a lightening and surge protection element 504 that further provides output to an AC-DC converter 506 having outputs in positive (POS) or negative (NEG) feeding to an input protection circuit 508 along with a RL-DC 524 with a NC 526 to DC good 514 or COM 516 connection. The input protection circuit 508 further feeds into DC/DC converter 510. The DC/DC converter 510 further provides POS or NEG inputs to a backup battery 528 having a charging control 530. An RL-AC 520 with a NC 522 was feeding into an AC good 512 and COM 516 connection before the AC main switch 502. The backup battery 528 outputs to SOM PWR and DGND.

Figure 6:
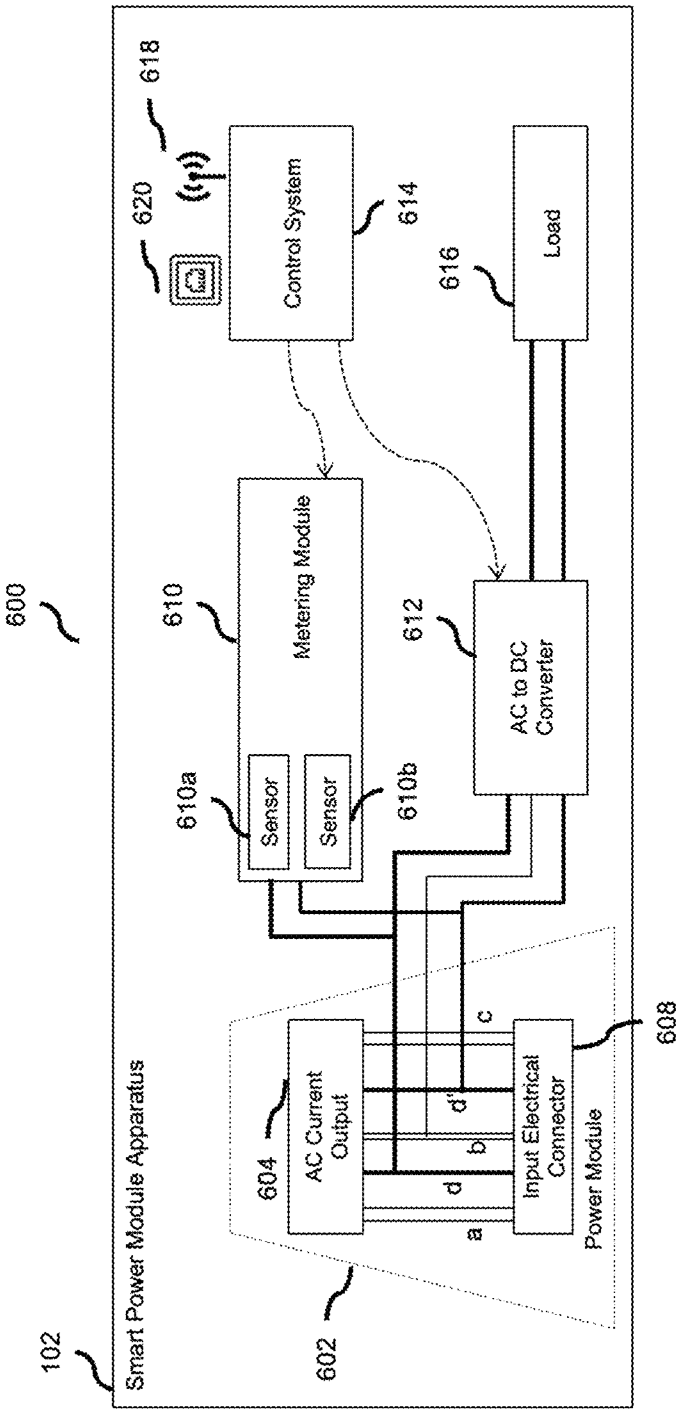
FIG. 6 is a schematic diagram of functional modules for implementing a method for monitoring and controlling a smart power apparatus according to another embodiment of the present disclosure.

FIG. 6 is a schematic diagram 600 of functional modules for implementing a method for monitoring and controlling a smart power apparatus according to another embodiment of the present disclosure.

In one implementation, a smart power module apparatus 102 has a power module 602 having an input electrical connector 608, equivalent to an electrical connector 210 as described earlier, provides an AC current output 604 to the circuit a, b, c, d, d'. The input AC is sent to an AC to DC converter 612 and provided to a customer device 120 load 616. The metering module 610, equivalent to a metering module 432 as described above, has a plurality of sensors 610*a*, 610*b* for monitoring and recording metering information. The metering module 610 and the AC to DC converter 612 communicates with a control system 614 having an Ethernet port 620 and/or a IoT port 618. The smart power module apparatus 102 communicates with a control centre 112 using the communication module having the Ethernet port 620 and/or the IoT port 618.

Figure 7:
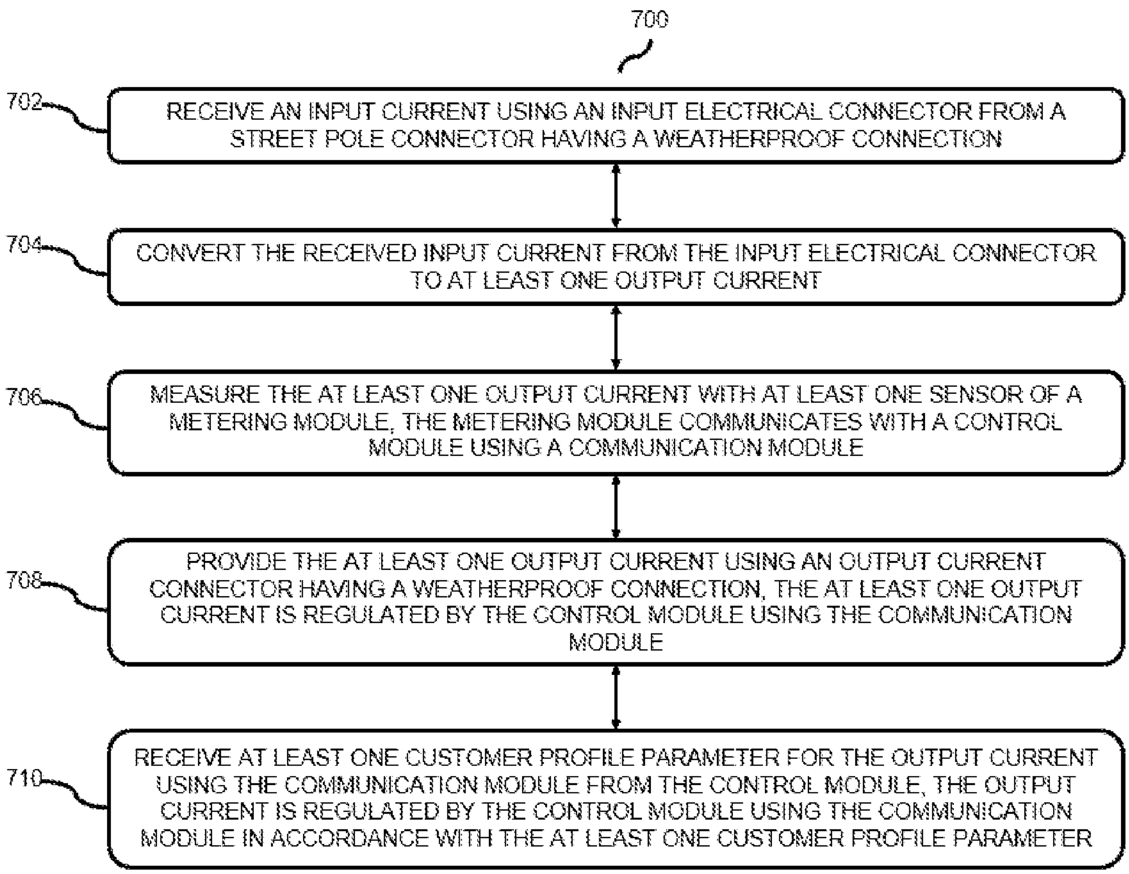
FIG. 7 illustrates an exemplary flowchart of a method for monitoring and controlling a smart power apparatus, in accordance with an embodiment of the present disclosure.

FIG. 7 illustrates an exemplary flowchart of a method 700 for monitoring and controlling a smart power apparatus, in accordance with an embodiment of the present disclosure.

In one implementation, a method 700 for smart power module is shown. The method may be described in the general context of computer-executable instructions. Generally, computer-executable instructions can include routines, programs, objects, components, data structures, procedures, modules, functions, etc., that perform particular functions or implement particular abstract data types. The method may also be practiced in a distributed computing environment where functions are performed by remote processing devices that are linked through a communication network. In a distributed computing environment, computer-executable instructions may be located in any local or remote, or cloud-based computer storage media, including memory storage devices. The order in which the method is described and is not intended to be construed as a limitation and any number of the described method blocks can be combined in any order to implement the method or alternate methods. Additionally, individual blocks may be deleted from the method without departing from the spirit and scope of the disclosure described herein. Furthermore, the method may be implemented in any suitable hardware, software, firmware, or combination thereof. However, for case of explanation, in the embodiments described below, the method may be implemented in the above-described system.

At step/block 702, receive an input current using an input electrical connector from a street pole connector having a weatherproof connection. In one implementation, the input AC current is received using an input electrical connector 210 connected to a streetlight 104.

At step/block 704, convert the received input current from the input electrical connector to at least one output current. In one implementation, the received input AC current is converted to a DC output using a conversion module 430. In one implementation, the received input AC current is used as AC output directly.

At step/block 706, measure the at least one output DC current with at least one sensor of a metering module 432, measure the at least one output AC current with at least one sensor of the metering module 432. In one implementation, the metering module 432 communicates with a control module using a communication module 434.

At step/block 708, provide the at least one output DC current using an output current connector having a weatherproof connection and the at least one output AC current using an output current connector having a weatherproof connection. In one implementation, the at least one output DC current is regulated by the control module using the communication module 434. In one implementation, the at least one output AC current is regulated by the control module using the communication module 434.

At step/block 710, receive at least one customer profile parameter for the output DC current using the communication module 434 from the control module. In one implementation, the output DC current is regulated by the control module using the communication module 434 in accordance with the at least one customer profile parameter. Receive at least one customer profile parameter for the output AC current using the communication module 434 from the control module. In one implementation, the output AC current is regulated by the control module using the communication module 434 in accordance with the at least one customer profile parameter.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition, or step being referred to is an optional (not required) feature of the subject matter.

The subject matter has been described with reference to various specific and preferred embodiments and techniques. However, it should be understood that many variations and modifications may be made while remaining within the spirit and scope of the subject matter. It will be apparent to one of ordinary skill in the art that methods, devices, device elements, materials, procedures, and techniques other than those specifically described herein can be applied to the practice of the subject matter as broadly disclosed herein without resort to undue experimentation. All art-known functional equivalents of methods, devices, device elements, materials, procedures, and techniques described herein are intended to be encompassed by this subject matter. Whenever a range is disclosed, all subranges and individual values are intended to be encompassed. This subject matter is not to be limited by the embodiments disclosed, including any shown in the drawings or exemplified in the specification, which are given by way of example and not of limitation.

While the subject matter has been described with respect to a limited number of embodiments, those skilled in the art, having benefit of this disclosure, will appreciate that other embodiments can be devised which do not depart from the scope of the subject matter as disclosed herein.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application.

I hereby claim:

1. A first smart power apparatus of a plurality of smart power apparatus for connecting to a street pole, the first smart power apparatus comprising:

a casing having a top plate, a bottom plate, and at least one wall with cooling fins to connect the top plate and the bottom plate, the casing further comprising:

a communication module to communicate with a control module;

an input electrical connector integrated with the casing to receive an input alternating current (AC) from a street pole connector using a weatherproof connection;

a conversion module operable to receive the input AC from the input electrical connector and produce an output direct current (DC), wherein the output DC is produced using a switch mode power supply (SMPS) transformer;

a metering module connected to circuits of the output DC with at least one sensor to measure the output DC, wherein the metering module communicates with the control module using the communication module;

an output DC connector integrated with the casing to provide the output DC using a weatherproof connection, wherein the output DC is regulated by the control module using the communication module, wherein the control module has access to a plurality of customer profiles, wherein the control module regulates output DC of each of the plurality of smart power apparatus in accordance with at least one customer profile of the plurality of customer profiles.

2. The first smart power apparatus of claim 1, wherein the casing further comprising:

the conversion module operable to receive the input AC from the input electrical connector and produce an output AC;

the metering module connected to circuits of the output AC with at least one sensor to measure the output AC; wherein the metering module communicates with the control module using the communication module;

an output AC connector integrated with the casing to provide the output AC using a weatherproof connection, wherein the output AC is regulated by the control module using the communication module.

3. The first smart power apparatus of claim 1, wherein the metering module provides a corresponding utility grade metering for the output DC of the first smart power apparatus to the control module using the communication module and assists a user to monitor energy usage.

4. The first smart power apparatus of claim 1, wherein the at least one wall has an embedded cellular antenna.

5. The first smart power apparatus of claim 1, wherein the bottom plate of the casing has a modular connection to connect with the street pole.

6. The first smart power apparatus of claim 1, wherein the control module communicates with the plurality of smart power apparatus each having a corresponding communication module and an output DC connector, wherein the output DC connector of each of the plurality of smart power apparatus has a unique identity and the control module regulates the output DC of the output DC connector of each of the smart power apparatus.

7. The first smart power apparatus of claim 1, wherein the control module regulates the output DC of each of the plurality of smart power apparatus in accordance with one customer profile parameter of the plurality of customer profiles, wherein the one customer profile parameter of the plurality of customer profiles is augmented by monitoring the output DC of each of the plurality of smart power apparatus.

8. A first smart power apparatus of a plurality of smart power apparatus for connecting to a street pole, the first power apparatus comprising:

a casing having a top plate, a bottom plate, and at least one wall with cooling fins to connect the top plate and the bottom plate, the casing further comprising:

a communication module to communicate with a control module;

an input electrical connector integrated with the casing to receive an input alternating current (AC) from a street pole connector using a weatherproof connection;

a conversion module operable to receive the input AC from the input electrical connector and produce an output AC;

a metering module connected to circuits of the output AC with at least one sensor to measure the output AC, wherein the metering module communicates with the control module using the communication module;

an output AC connector integrated with the casing to provide the output AC using a weatherproof connection, wherein the output AC is regulated by the control module using the communication module, wherein the control module has access to a plurality of customer profiles, wherein the control module regulates output AC of each of the plurality of smart power apparatus in accordance with at least one customer profile of the plurality of customer profiles.

9. The first smart power apparatus of claim 8, wherein the casing further comprising:

the conversion module operable to receive the input AC from the input electrical connector and produce an output direct current (DC);

the metering module connected to circuits of the output DC with at least one sensor to measure the output DC; wherein the metering module communicates with the control module using the communication module;

an output DC connector integrated with the casing to provide the output DC using a weatherproof connection, wherein the output DC is regulated by the control module using the communication module.

10. The first smart power apparatus of claim 8, wherein the communication module has a communication layer and communicates with the control module using a connector.

11. The first smart power apparatus of claim 8, wherein the metering module provides a corresponding utility grade metering for the output AC of the first smart power apparatus to the control module using the communication module and assists a user to monitor energy usage.

12. The first smart power apparatus of claim 8, wherein the control module communicates with the plurality of smart power apparatus each having a corresponding communication module and an output AC connector, wherein the output AC connector of each of the plurality of smart power apparatus has a unique identity and the control module regulates the output AC of each of the output AC connector of each of the plurality of smart power apparatus.

13. A method for monitoring and controlling a first smart power apparatus of a plurality of smart power apparatus for connecting to a street pole, the method comprising:

receiving an input current using an input electrical connector from a street pole connector having a weatherproof connection;

converting the received input current from the input electrical connector to at least one output current;

measuring the at least one output current with at least one sensor of a metering module, wherein the metering module communicates with a control module using a communication module;

providing the at least one output current using an output current connector having a weatherproof connection, wherein the at least one output current is regulated by the control module using the communication module, wherein the control module has access to a plurality of customer profiles, wherein the control module regulates at least one output current of each of the plurality of smart power apparatus in accordance with at least one customer profile of the plurality of customer profiles.

14. The method of claim 13, the method further comprising:

receiving at least one customer profile parameter for the at least one output current of the first smart power apparatus using the communication module from the control module;

wherein the at least one output current of the first smart power apparatus is regulated by the control module using the communication module in accordance with the at least one customer profile parameter.

15. The method of claim 13, the method further comprising: generating a corresponding utility grade metering for the at least one output current of the first smart power apparatus and assisting a user to monitor energy usage.

16. The method of claim 13, wherein the control module communicates with the plurality of smart power apparatus each having a corresponding communication module and output current connector, wherein the output current connector of each of the plurality of smart power apparatus has a unique identity and the control module regulates the at least one output current of the output current connector of each of the plurality of smart power apparatus.

17. The method of claim 13, wherein the control module regulates the at least one output current of each of the plurality of smart power apparatus in accordance with one customer profile parameter of the plurality of customer profiles, wherein the one customer profile parameter of the plurality of customer profiles is augmented by monitoring the at least one output current of each of the plurality of smart power apparatus.

* * * * *